United States Patent
Vilas Boas et al.

(10) Patent No.: US 10,061,339 B1
(45) Date of Patent: Aug. 28, 2018

(54) FEEDBACK CIRCUIT AND METHODS FOR NEGATIVE CHARGE PUMP

(71) Applicant: NXP USA, Inc., Austin, TX (US)

(72) Inventors: Andre Luis Vilas Boas, Amparo (BR); Richard Titov Lara Saez, Campinas (BR); Ivan Carlos Ribeiro Do Nascimento, Campinas (BR); Marcelo de Paula Campos, Chandler, AZ (US); Pedro Barbosa Zanetta, Campinas (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/802,965

(22) Filed: Nov. 3, 2017

(51) Int. Cl.
  *G05F 3/26* (2006.01)
  *G11C 5/14* (2006.01)
  *G05F 3/20* (2006.01)
  *H03F 3/45* (2006.01)
  *H02M 1/08* (2006.01)

(52) U.S. Cl.
  CPC ............... *G05F 3/26* (2013.01); *G05F 3/205* (2013.01); *G11C 5/146* (2013.01); *H02M 1/083* (2013.01); *H03F 3/45475* (2013.01); *H03F 2200/78* (2013.01)

(58) Field of Classification Search
  CPC combination set(s) only.
  See application file for complete search history.

(56) References Cited

U.S. PATENT DOCUMENTS

| | | | | |
|---|---|---|---|---|
| 5,448,159 A | * | 9/1995 | Kojima | G05F 3/262 323/313 |
| 5,687,201 A | * | 11/1997 | McClellan | H03L 7/0898 327/157 |
| 6,005,434 A | * | 12/1999 | Tsukikawa | G11C 5/146 327/534 |
| 6,819,162 B2 | | 11/2004 | Pelliconi | |
| 6,903,599 B2 | | 6/2005 | Chen et al. | |
| 7,362,163 B1 | | 4/2008 | Raghavan | |
| 7,701,281 B1 | | 4/2010 | Raghavan | |
| 7,834,680 B2 | * | 11/2010 | Kim | G11C 5/147 327/536 |
| 8,830,776 B1 | | 9/2014 | Choy et al. | |
| 9,250,271 B2 | | 2/2016 | Muench et al. | |
| 2016/0126831 A1 | | 5/2016 | Fowers et al. | |
| 2016/0181913 A1 | | 6/2016 | Feng | |

* cited by examiner

*Primary Examiner* — An Luu

(57) ABSTRACT

A circuit includes first, second, and third power supply terminals. The circuit includes an input node coupled to receive a negative voltage and an output node coupled to provide a positive voltage proportional to the negative voltage. The circuit includes a voltage-to-current converter coupled to the first power supply terminal and the input node and configured to generate an intermediate current proportional to the negative voltage at the input node. The circuit also includes a current mirror coupled to the second power supply terminal and third power supply terminal and configured to mirror the intermediate current through a first resistor to provide the positive proportional voltage.

20 Claims, 2 Drawing Sheets

FEEDBACK CIRCUIT AND METHODS FOR NEGATIVE CHARGE PUMP

BACKGROUND

Field

This disclosure relates generally to semiconductor devices, and more specifically, to sensing voltages for circuits with reverse back biasing.

Related Art

Charge pumps are common blocks in modern microcontroller architectures; for instance, within FLASH memories blocks to generate program/erase voltages. In more advanced technological nodes, charge pumps can be employed to generate bulk/back biasing of logic gates. Biasing techniques are a key element to control the threshold voltage of logic devices to reduce leakage as well as increase speed.

Fully Depleted Silicon-On-Insulator (FDSOI) is a breakthrough technology that overcomes the limited back bias ranges of conventional bulk technologies. In order to generate the back bias voltage for PMOS devices, a regulated charge pump is necessary.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of devices disclosed herein include regulated charge pumps to support extended forward back biasing (FBB) for PMOS devices. Sense circuitry is used to regulate a charge pump by providing a level-shifted positive feedback voltage that is proportional to the negative voltage output by the charge pump. Calibration is not required for the sense circuitry because the feedback path does not require a reference current or voltage. Moreover, there are no switches to control in the feedback path.

Figure 1:
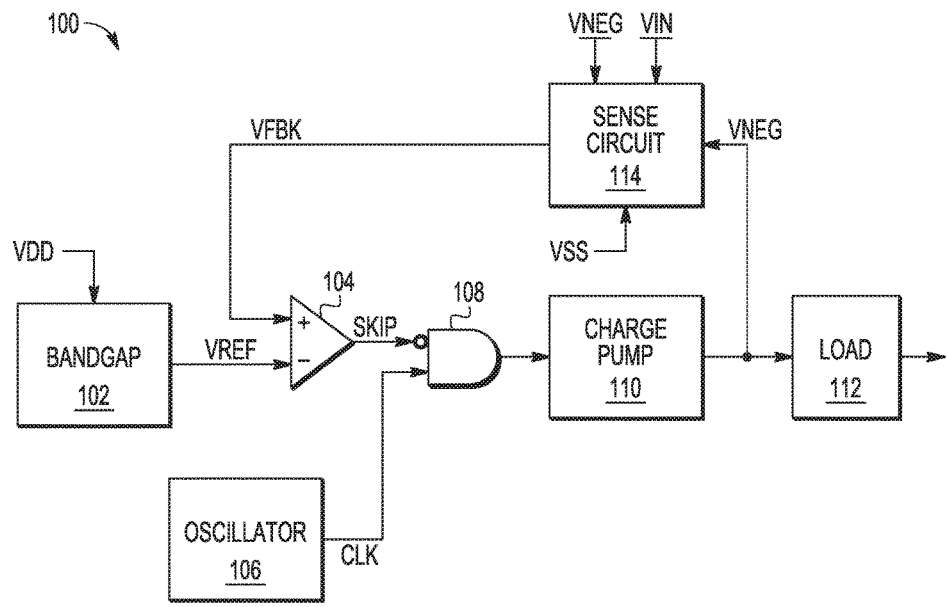
FIG. 1 illustrates a block diagram of an embodiment of a semiconductor device for a charge pump with reverse back biasing in accordance with the present invention.

FIG. 1 illustrates a block diagram of an embodiment of a semiconductor device 100 for a charge pump with reverse back biasing in accordance with the present invention that includes bandgap circuitry 102, comparator 104, clock oscillator 106, logic gate 108, charge pump 110, load 112 and sense circuit 114. Bandgap circuit 102 is coupled to supply voltage VDD and is configured to supply a reference voltage VREF to a negating input of comparator 104. Sense circuit 114 provides a feedback voltage signal VFBK to a non-negating input of comparator 104. Output of comparator 104 is provided to a first input of logic gate 108, which is implemented as an AND gate in the example shown. Another input of logic gate 108 is coupled to receive the clock signal CLK from oscillator 106. Output from logic gate 108 is provided to charge pump 110, and output from charge pump (VNEG) 110 is provided to load 112, and to sense circuit 114. Sense circuit 114 is also coupled to supply voltage VSS.

Semiconductor device 100 provides a regulated charge pump 110 that can support FBB in Ultra-Thin Body and Buried Oxide (UTBB) Fully Depleted Silicon-On-Insulator (FDSOI) technology. FBB can be used to maximize battery lifetime but may also be applied to compensate for die-to-die and within-die process variations. Charge pump 110 can be implemented using two voltage-boosting cells in cascade and can be based on digital pulse skipping as disclosed in U.S. Pat. No. 6,819,162 issued to Pelliconi on Nov. 16, 2004. Other suitable configurations for charge pump 110 can be used. Sense circuit 114 receives a negative voltage VNEG from charge pump 110 and translates negative voltage VNEG to a positive feedback voltage VFBK (i.e., between VSS and VDD). Positive feedback voltage VFBK is compared to a positive reference voltage provided by bandgap circuit 102. Under these conditions, sense circuit 114 can be exposed to voltages higher than supply voltage VDD. Thus, a configuration for sense circuit 114 that is capable of handling voltage higher than supply voltage VDD is disclosed herein.

Figure 2:
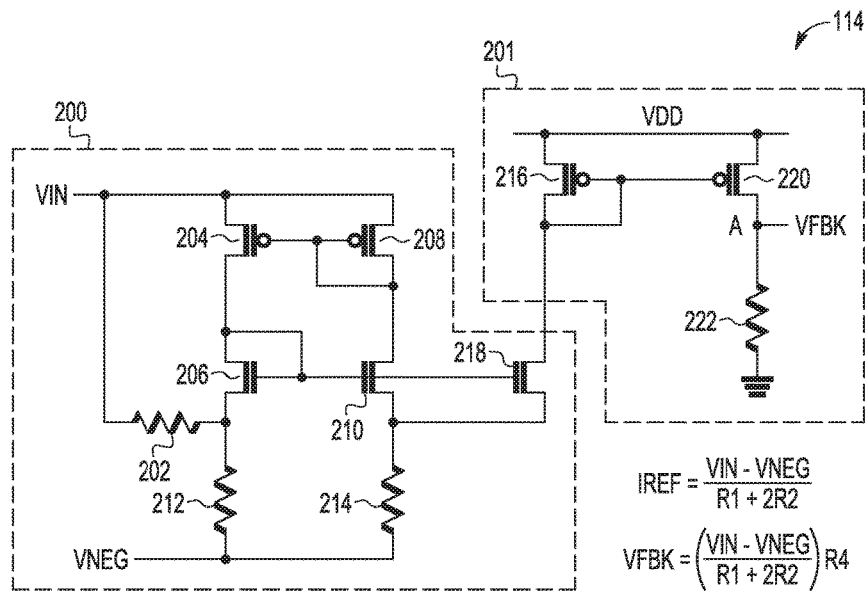
FIG. 2 illustrates a schematic diagram of an embodiment of a sense circuit that can be used in the semiconductor device of FIG. 1.

FIG. 2 illustrates a schematic diagram of an embodiment of a sense circuit 114 that can be used in the semiconductor device 100 of FIG. 1 that includes a voltage to current (V2I) converter 200 with resistors 202, 212, 214, PMOS transistors 204, 208, 220, and NMOS transistors 206, 210, 218, and a current mirror 201 with PMOS transistors 216, 220 and resistor 222. Resistor 202 includes a first terminal coupled to input voltage VIN, and a second terminal coupled to a source electrode of NMOS transistor 206 and a first terminal of resistor 212. A second terminal of resistor 212 is coupled to negative voltage VNEG (from charge pump 110). NMOS transistor 206 includes a source electrode coupled to the first terminal of resistor 212 and the second terminal of resistor 202, a gate electrode coupled to gate electrodes of NMOS transistors 210, 218, and a drain electrode coupled to the gate electrode of NMOS transistor 206 and a drain electrode of PMOS transistor 204. PMOS transistor 204 further includes a source electrode coupled to input voltage VIN, a source electrode of PMOS transistor 208, and the first terminal of resistor 202, and a gate electrode coupled to the gate electrode of PMOS transistor 208. PMOS transistor 208 further includes a drain electrode coupled to the drain electrode of NMOS transistor 210 and a gate electrode coupled to the drain electrode of PMOS transistor 208. NMOS transistor 210 further includes a gate electrode coupled to the gate electrodes of NMOS transistors 206, 218, and a source electrode coupled a first terminal of resistor 214 and to a source electrode of NMOS transistor 218. Resistor 214 includes a first terminal coupled to the source electrodes of NMOS transistors 210, 218 and a second terminal coupled to the second terminal of resistor 212 and negative voltage VNEG. NMOS transistor 218 further includes a gate electrode coupled to the gate electrodes of NMOS transistors 206, 210 and a drain electrode coupled to the drain and gate electrodes of PMOS transistor 216. PMOS transistor 216 further includes a gate electrode coupled to the gate electrode of PMOS transistor 220 and the drain electrode of PMOS transistor 216, and a source electrode coupled to supply voltage VDD and a source electrode of PMOS transistor 220. PMOS transistor 220 further includes a gate electrode coupled to the gate electrode of PMOS transistor 216 and a drain electrode coupled to a first terminal of resistor 222. A second terminal of resistor 222 is coupled to supply voltage VSS, which may be ground. Feedback voltage VFBK is provided at node A between the drain electrode of PMOS transistor 220 and the first terminal of resistor 222.

If transistors 206, 210, 218 and resistors 212 and 214 are matched, V2I converter 200 generates a current (IREF) that is proportional to the negative voltage VNEG output by charge pump 110 according to the following equation:

$$IREF=(VIN-VNEG)/(R1+2R2).$$

In current mirror 201, reference current IREF is converted to positive feedback voltage VFBK at node A. If resistor 222 matches resistors 212, 214, output voltage mismatch caused by differences in the temperature coefficient of resistors 212, 214 and 222 cancels out, eliminating the need to trim sense circuit 114. Sense circuit 114 does not require an amplifier to convert voltage to current, saving space, reducing power consumption, and eliminating the need for amplifier compensation. In addition, the source electrodes of NMOS transistors 206, 210 are degenerated, allowing sense circuit 114 to operate on lower supply voltage.

Figure 3:
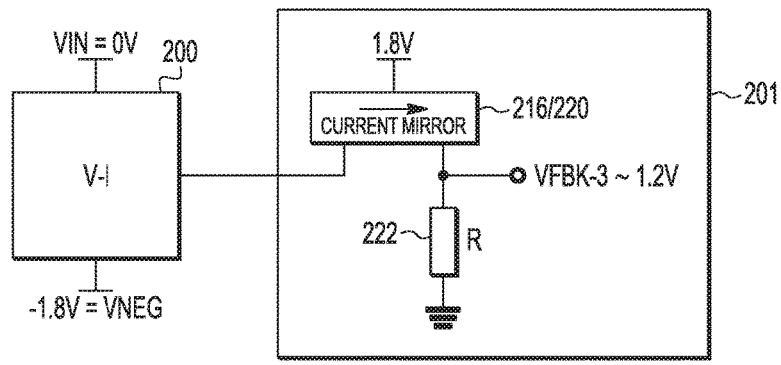
FIG. 3 illustrates a block diagram of an embodiment of a sense circuit that can be used in the semiconductor device of FIG. 1.
Figure 5:
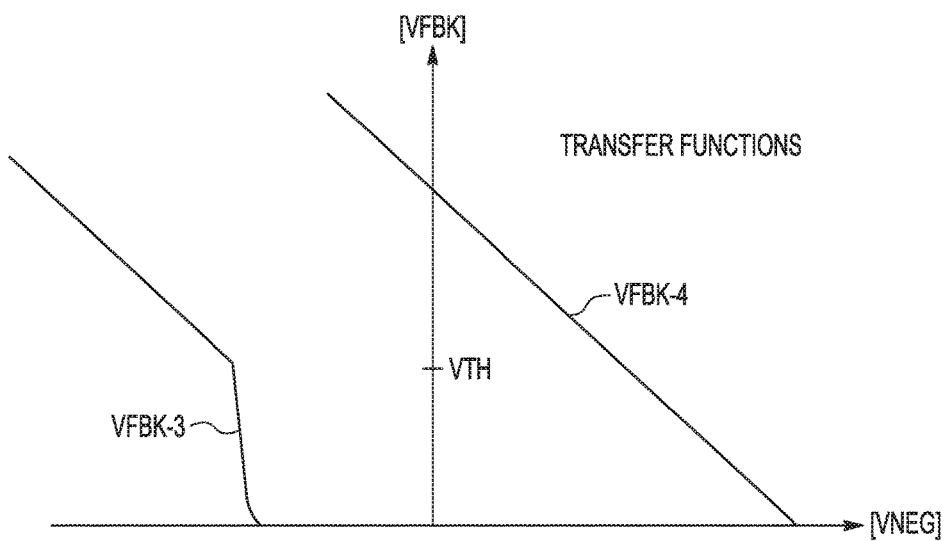
FIG. 5 illustrates graphs of feedback voltage versus negative voltage for the sense circuits shown in FIGS. 3 and 4.

FIG. 3 illustrates a block diagram of an embodiment of sense circuit 114 that can be used in the semiconductor device 100 of FIG. 1 with an example of voltages that can be used. Sense circuit 114 includes voltage to current converter 200 and current mirror 201 that may be coupled to one another as shown in FIG. 2. Input voltage VIN is at zero (0) Volts, negative voltage VNEG is at −1.8 Volts, supply voltage VDD is at 1.8 Volts, and the value of feedback voltage VFBK is approximately 1.2 Volts. FIG. 5 shows a graph (VFBK-3) of feedback voltage versus negative voltage for the voltages applied to sense circuit 114 shown in FIG. 3. Notice that the VFBK-3 curve has a linear negative slope until the feedback voltage reaches the threshold voltage VTH of transistors 216/220 in current mirror 201. At VTH, the slope of the VFBK-3 curve increases sharply and becomes substantially vertical, indicating a limited range of response for feedback voltage VFBK to comparator 104 (FIG. 1).

Figure 4:
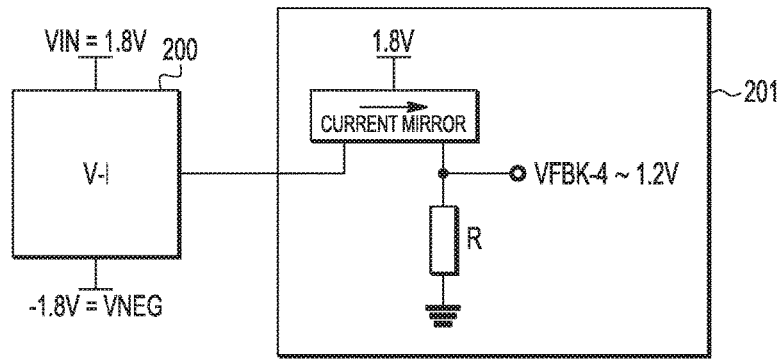
FIG. 4 illustrates a block diagram of another embodiment of a sense circuit that can be used in the semiconductor device of FIG. 1.

FIG. 4 illustrates a block diagram of an embodiment of sense circuit 114 that can be used in the semiconductor device 100 of FIG. 1 with another example of voltages that can be used to increase the range of response for feedback voltage VFBK. Sense circuit 114 includes voltage to current converter 200 and current mirror 201 that may be coupled to one another as shown in FIG. 2. Input voltage VIN is at 1.8 Volts, negative voltage VNEG is at −1.8 Volts, supply voltage VDD is at 1.8 Volts, and the value of feedback voltage VFBK is approximately 1.2 Volts. FIG. 5 shows a graph (VFBK-4) of feedback voltage versus negative voltage for the voltages applied to sense circuit 114 shown in FIG. 4. Notice that the feedback voltage (VFBK-4) has a constant linear negative slope through the entire range of negative voltage (VNEG), indicating a full range of response for feedback voltage VFBK to comparator 104 (FIG. 1). One tradeoff to having a full range of feedback voltage response is that power consumption is higher with input voltage (VIN) set to 1.8 Volts as shown in FIG. 4 than at zero Volts as shown in FIG. 3.

By now it should be appreciated that in selected embodiments there has been provided a circuit (114) for converting a negative voltage to a positive proportional voltage that can comprise a first power supply terminal (VIN), a second power supply terminal (VDD), a third power supply terminal (Vss), an input node coupled to receive the negative voltage (VNEG), an output node (VFBK) coupled to provide the positive proportional voltage, a voltage-to-current converter (200) coupled to the first power supply terminal and the input node and configured to generate an intermediate current proportional to the negative voltage at the input node, and a current mirror (201, 216/220) coupled to the second power supply terminal and third power supply terminal and configured to mirror the intermediate current through a first resistor (R4) to provide the positive proportional voltage.

In another aspect, the current mirror can comprise a first transistor (216) of a first conductivity type having a first current electrode coupled to the second power supply terminal, a second current electrode coupled to the voltage-to-current converter to receive the intermediate current, and a control electrode coupled to the second current electrode, a second transistor (220) of the first conductivity type having a first current electrode coupled to the second power supply terminal, a second current electrode coupled to a first terminal of the first resistor, and a control electrode coupled to the control electrode of the first transistor. The first terminal of the first resistor can provide the positive proportional voltage.

In another aspect, the voltage to current converter can comprise a first transistor (204) of a first conductivity type having a first current electrode coupled to the first power supply terminal, a control electrode, and a second current electrode; a second transistor (208) of the first conductivity type having a first current electrode coupled to the first power supply terminal, a control electrode coupled to the control electrode of the first transistor, and second current electrode coupled to the control electrode of the second transistor; a third transistor (206) of a second conductivity type having a first current electrode coupled to the second current electrode of the first transistor, a control electrode coupled to the first current electrode of the third transistor, and a second current electrode coupled to the input node; and a fourth transistor (210) of the second conductivity type having a first current electrode coupled to the second current electrode of the second transistor, a control electrode coupled to the control electrode of the third transistor, and a second current electrode coupled to the input node.

In another aspect, the voltage to current converter can further comprise a second resistor (R2 212) coupled between the second current electrode of the third transistor and the input node; and a third resistor (R3 214) coupled between the second current electrode of the fourth transistor and the input node.

In another aspect, the voltage to current converter can further comprise a fifth transistor (218) of the second conductivity type having a first current electrode which provides the intermediate current, a control electrode coupled to the control electrode of the fourth transistor, and a second current electrode coupled to the second current electrode of the fourth transistor.

In another aspect, the second resistor and the third resistor have a same resistance value.

In another aspect, the voltage to current converter can further comprise a fourth resistor (R1 202) coupled between the second current electrode of the third transistor and the first power supply terminal.

In another aspect, the current mirror can comprise a sixth transistor (216) of the first conductivity type having a first current electrode coupled to the second power supply terminal, a second current electrode coupled to the first current electrode of the fifth transistor, and a control electrode coupled to the second current electrode of the seventh transistor; and a seventh transistor (220) of the first conductivity type having a first current electrode coupled to the second power supply terminal, a second current electrode coupled to a first terminal of the first resistor, and a control electrode coupled to the control electrode of the sixth transistor. The first terminal of the first resistor can provide the positive proportional voltage.

In another aspect, the first, second, and third resistors can be a same type of resistor.

In another aspect, a supply voltage at the second power supply terminal (VDD) can be greater than a supply voltage at the first power supply terminal (VIN) and the supply voltage at the first power supply terminal (VIN) can be greater than the negative voltage (VNEG).

In another aspect, the circuit can further comprise a negative charge pump (108) coupled to provide the negative voltage to the input node.

In another aspect, the circuit can further comprise a comparator (104) coupled to receive the positive proportional voltage and a reference voltage (vref); and a logic circuit (106) coupled to receive an output of the comparator and a clock signal (105), and coupled to provide a control signal to the negative charge pump in response to the output of the comparator and clock signal.

In other embodiments, a circuit for converting a negative voltage to a positive proportional voltage can comprise a first power supply terminal (Vin); a second power supply terminal (Vdd); a third power supply terminal (Vss); an input node coupled to receive the negative voltage (Vneg) from a negative charge pump; an output node (Vfbk) coupled to provide the positive proportional voltage; a voltage-to-current converter coupled to the first power supply terminal and the input node and configured to generate an intermediate current proportional to the negative voltage at the input node; a first resistor (R4); a first transistor (216) of a first conductivity type having a first current electrode coupled to the second power supply terminal, a second current electrode coupled to the voltage-to-current converter to receive the intermediate current, and a control electrode coupled to the second current electrode; and a second transistor (220) of the first conductivity type having a first current electrode coupled to the second power supply terminal, a second current electrode coupled to a first terminal of the first resistor, and a control electrode coupled to the control electrode of the first transistor. The first terminal of the first resistor can provide the positive proportional voltage.

In another aspect, the voltage to current converter can comprise a third transistor (204) of a first conductivity type having a first current electrode coupled to the first power supply terminal, a control electrode, and a second current electrode; a fourth transistor (208) of the first conductivity type having a first current electrode coupled to the first power supply terminal, a control electrode coupled to the control electrode of the third transistor, and second current electrode coupled to the control electrode of the fourth transistor; a fifth transistor (206) of a second conductivity type having a first current electrode coupled to the second current electrode of the third transistor, a control electrode coupled to the first current electrode of the fifth transistor, and a second current electrode coupled to the input node; and a sixth transistor (210) of the second conductivity type having a first current electrode coupled to the second current electrode of the fourth transistor, a control electrode coupled to the control electrode of the fifth transistor, and a second current electrode coupled to the input node.

In another aspect, the voltage to current converter can further comprise a second resistor (R2 212) coupled between the second current electrode of the fifth transistor and the input node; a third resistor (R3 214) coupled between the second current electrode of the sixth transistor and the input node; and a fourth resistor (R1 202) coupled between the second current electrode of the fifth transistor and the first power supply terminal.

In another aspect, the voltage to current converter can further comprise a seventh transistor (218) of the second conductivity type having a first current electrode which provides the intermediate current, a control electrode coupled to the control electrode of the sixth transistor, and a second current electrode coupled to the second current electrode of the sixth transistor.

In another aspect, the second resistor and the third resistor have a same resistance value.

In still further selected embodiments, in a circuit having a first power supply terminal (Vin), a second power supply terminal (Vdd), and a third power supply terminal (Vss), a method can comprise providing a negative voltage to an input node of a voltage-to-current converter powered by the first power supply terminal; generating an intermediate current proportional to the negative voltage at the input node of the voltage-to-current converter; and using a current mirror powered by the second supply power terminal to mirror the intermediate current at the output node of the voltage-to-current converter through a resistor to the third power supply terminal to provide a positive proportional voltage at a first terminal of the resistor that is proportional to the negative voltage.

In another aspect, the current mirror can comprise a first transistor (216) of a first conductivity type having a first current electrode coupled to the second power supply terminal, a second current electrode coupled to the voltage-to-current converter to receive the intermediate current, and a control electrode coupled to the second current electrode; and a second transistor (220) of the first conductivity type having a first current electrode coupled to the second power supply terminal, a second current electrode coupled to a first terminal of the first resistor, and a control electrode coupled to the control electrode of the first transistor. The first terminal of the first resistor can provide the positive proportional voltage.

In another aspect, the voltage to current converter can comprise a first transistor (204) of a first conductivity type having a first current electrode coupled to the first power supply terminal, a control electrode, and a second current electrode; a second transistor (208) of the first conductivity type having a first current electrode coupled to the first power supply terminal, a control electrode coupled to the control electrode of the first transistor, and second current electrode coupled to the control electrode of the second transistor; a third transistor (206) of a second conductivity type having a first current electrode coupled to the second current electrode of the first transistor, a control electrode coupled to the first current electrode of the third transistor, and a second current electrode coupled to the input node; a fourth transistor (210) of the second conductivity type having a first current electrode coupled to the second current electrode of the second transistor, a control electrode coupled to the control electrode of the third transistor, and a second current electrode coupled to the input node; a second resistor (R2 212) coupled between the second current electrode of the fifth transistor and the input node; a third resistor (R3 214) coupled between the second current electrode of the sixth transistor and the input node; and a fourth resistor (R1 202) coupled between the second current electrode of the fifth transistor and the first power supply terminal.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit for converting a negative voltage to a positive proportional voltage, the circuit comprising:
   a first power supply terminal;
   a second power supply terminal;
   a third power supply terminal;
   an input node coupled to receive the negative voltage;
   an output node coupled to provide the positive proportional voltage;
   a voltage-to-current converter coupled to the first power supply terminal and the input node and configured to generate an intermediate current proportional to the negative voltage at the input node; and
   a current mirror coupled to the second power supply terminal and third power supply terminal and configured to mirror the intermediate current through a first resistor to provide the positive proportional voltage.

2. The circuit of claim 1, wherein the current mirror comprises:
   a first transistor of a first conductivity type having a first current electrode coupled to the second power supply terminal, a second current electrode coupled to the voltage-to-current converter to receive the intermediate current, and a control electrode coupled to the second current electrode; and
   a second transistor of the first conductivity type having a first current electrode coupled to the second power supply terminal, a second current electrode coupled to a first terminal of the first resistor, and a control electrode coupled to the control electrode of the first transistor, wherein the first terminal of the first resistor provides the positive proportional voltage.

3. The circuit of claim 1, wherein the voltage to current converter comprises:
   a first transistor of a first conductivity type having a first current electrode coupled to the first power supply terminal, a control electrode, and a second current electrode;
   a second transistor of the first conductivity type having a first current electrode coupled to the first power supply terminal, a control electrode coupled to the control electrode of the first transistor, and second current electrode coupled to the control electrode of the second transistor;
   a third transistor of a second conductivity type having a first current electrode coupled to the second current electrode of the first transistor, a control electrode coupled to the first current electrode of the third transistor, and a second current electrode coupled to the input node; and
   a fourth transistor of the second conductivity type having a first current electrode coupled to the second current electrode of the second transistor, a control electrode coupled to the control electrode of the third transistor, and a second current electrode coupled to the input node.

4. The circuit of claim 3, wherein the voltage to current converter further comprises:
   a second resistor coupled between the second current electrode of the third transistor and the input node; and
   a third resistor coupled between the second current electrode of the fourth transistor and the input node.

5. The circuit of claim 4, wherein the voltage to current converter further comprises:
   a fifth transistor of the second conductivity type having a first current electrode which provides the intermediate current, a control electrode coupled to the control electrode of the fourth transistor, and a second current electrode coupled to the second current electrode of the fourth transistor.

6. The circuit of claim 4, wherein the second resistor and the third resistor have a same resistance value.

7. The circuit of claim 4, wherein the voltage to current converter further comprises:
   a fourth resistor coupled between the second current electrode of the third transistor and the first power supply terminal.

8. The circuit of claim 5, wherein the current mirror comprises:
   a sixth transistor of the first conductivity type having a first current electrode coupled to the second power supply terminal, a second current electrode coupled to the first current electrode of the fifth transistor, and a control electrode coupled to the second current electrode of the seventh transistor; and
   a seventh transistor of the first conductivity type having a first current electrode coupled to the second power supply terminal, a second current electrode coupled to a first terminal of the first resistor, and a control electrode coupled to the control electrode of the sixth transistor, wherein the first terminal of the first resistor provides the positive proportional voltage.

9. The circuit of claim 8, wherein the first, second, and third resistors are a same type of resistor.

10. The circuit of claim 1, wherein a supply voltage at the second power supply terminal is greater than a supply voltage at the first power supply terminal and the supply voltage at the first power supply terminal is greater than the negative voltage.

11. The circuit of claim 1, further comprising:
a negative charge pump coupled to provide the negative voltage to the input node.

12. The circuit of claim 11, further comprising:
a comparator coupled to receive the positive proportional voltage and a reference voltage; and
a logic circuit coupled to receive an output of the comparator and a clock signal, and coupled to provide a control signal to the negative charge pump in response to the output of the comparator and clock signal.

13. A circuit for converting a negative voltage to a positive proportional voltage, the circuit comprising:
a first power supply terminal;
a second power supply terminal;
a third power supply terminal;
an input node coupled to receive the negative voltage from a negative charge pump;
an output node coupled to provide the positive proportional voltage;
a voltage-to-current converter coupled to the first power supply terminal and the input node and configured to generate an intermediate current proportional to the negative voltage at the input node;
a first resistor;
a first transistor of a first conductivity type having a first current electrode coupled to the second power supply terminal, a second current electrode coupled to the voltage-to-current converter to receive the intermediate current, and a control electrode coupled to the second current electrode; and
a second transistor of the first conductivity type having a first current electrode coupled to the second power supply terminal, a second current electrode coupled to a first terminal of the first resistor, and a control electrode coupled to the control electrode of the first transistor, wherein the first terminal of the first resistor provides the positive proportional voltage.

14. The circuit of claim 13, wherein the voltage to current converter comprises:
a third transistor of a first conductivity type having a first current electrode coupled to the first power supply terminal, a control electrode, and a second current electrode;
a fourth transistor of the first conductivity type having a first current electrode coupled to the first power supply terminal, a control electrode coupled to the control electrode of the third transistor, and second current electrode coupled to the control electrode of the fourth transistor;
a fifth transistor of a second conductivity type having a first current electrode coupled to the second current electrode of the third transistor, a control electrode coupled to the first current electrode of the fifth transistor, and a second current electrode coupled to the input node; and
a sixth transistor of the second conductivity type having a first current electrode coupled to the second current electrode of the fourth transistor, a control electrode coupled to the control electrode of the fifth transistor, and a second current electrode coupled to the input node.

15. The circuit of claim 14, wherein the voltage to current converter further comprises:
a second resistor coupled between the second current electrode of the fifth transistor and the input node;
a third resistor coupled between the second current electrode of the sixth transistor and the input node; and
a fourth resistor coupled between the second current electrode of the fifth transistor and the first power supply terminal.

16. The circuit of claim 15, wherein the voltage to current converter further comprises:
a seventh transistor of the second conductivity type having a first current electrode which provides the intermediate current, a control electrode coupled to the control electrode of the sixth transistor, and a second current electrode coupled to the second current electrode of the sixth transistor.

17. The circuit of claim 16, wherein the second resistor and the third resistor have a same resistance value.

18. In a circuit having a first power supply terminal, a second power supply terminal, and a third power supply terminal, a method comprising:
providing a negative voltage to an input node of a voltage-to-current converter powered by the first power supply terminal;
generating an intermediate current proportional to the negative voltage at the input node of the voltage-to-current converter; and
using a current mirror powered by the second supply power terminal to mirror the intermediate current at the output node of the voltage-to-current converter through a resistor to the third power supply terminal to provide a positive proportional voltage at a first terminal of the resistor that is proportional to the negative voltage.

19. The method of claim 18, wherein the current mirror comprises:
a first transistor of a first conductivity type having a first current electrode coupled to the second power supply terminal, a second current electrode coupled to the voltage-to-current converter to receive the intermediate current, and a control electrode coupled to the second current electrode; and
a second transistor of the first conductivity type having a first current electrode coupled to the second power supply terminal, a second current electrode coupled to a first terminal of the first resistor, and a control electrode coupled to the control electrode of the first transistor, wherein the first terminal of the first resistor provides the positive proportional voltage.

20. The method of claim 18, wherein the voltage to current converter comprises:
a first transistor of a first conductivity type having a first current electrode coupled to the first power supply terminal, a control electrode, and a second current electrode;
a second transistor of the first conductivity type having a first current electrode coupled to the first power supply terminal, a control electrode coupled to the control electrode of the first transistor, and second current electrode coupled to the control electrode of the second transistor;
a third transistor of a second conductivity type having a first current electrode coupled to the second current electrode of the first transistor, a control electrode coupled to the first current electrode of the third transistor, and a second current electrode coupled to the input node;
a fourth transistor of the second conductivity type having a first current electrode coupled to the second current electrode of the second transistor, a control electrode coupled to the control electrode of the third transistor, and a second current electrode coupled to the input node;
a second resistor coupled between the second current electrode of the fifth transistor and the input node;
a third resistor coupled between the second current electrode of the sixth transistor and the input node; and
a fourth resistor coupled between the second current electrode of the fifth transistor and the first power supply terminal.

* * * * *